(12) United States Patent
Park

(10) Patent No.: US 9,368,201 B2
(45) Date of Patent: Jun. 14, 2016

(54) NONVOLATILE MEMORY DEVICE HAVING RESISTIVE MEMORY CELL AND METHOD SENSING DATA IN SAME

(71) Applicant: SAMSUNG ELECTRONICS CO., LTD., Suwon-Si, Gyeonggi-Do (KR)

(72) Inventor: Mu-Hui Park, Hwaseong-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/494,806

(22) Filed: Sep. 24, 2014

(65) Prior Publication Data

US 2015/0243352 A1    Aug. 27, 2015

(30) Foreign Application Priority Data

Feb. 21, 2014 (KR) .................. 10-2014-0020607

(51) Int. Cl.
| | |
|---|---|
| *G11C 13/00* | (2006.01) |
| *G11C 16/26* | (2006.01) |
| *G11C 7/06* | (2006.01) |
| *G11C 5/06* | (2006.01) |
| *G11C 11/56* | (2006.01) |
| *G11C 7/14* | (2006.01) |

(52) U.S. Cl.
CPC .......... *G11C 13/004* (2013.01); *G11C 11/5642* (2013.01); *G11C 11/5678* (2013.01); *G11C 13/0002* (2013.01); *G11C 13/0004* (2013.01); *G11C 7/14* (2013.01); *G11C 16/26* (2013.01); *G11C 2013/0045* (2013.01); *G11C 2013/0054* (2013.01); *G11C 2013/0057* (2013.01); *G11C 2213/71* (2013.01)

(58) Field of Classification Search
CPC ............... C11C 13/004; G11C 13/004; G11C 13/0004; G11C 11/5678; G11C 13/0054; G11C 13/0002; G11C 2013/0045; G11C 16/26; G11C 7/14
USPC ......... 365/163, 148, 158, 207, 210.1, 210.11, 365/210.12
See application file for complete search history.

(56) References Cited

U.S. PATENT DOCUMENTS

| | | |
|---|---|---|
| 6,693,827 B2 | 2/2004 | Kim |
| 6,735,727 B1 | 5/2004 | Lee |
| 7,245,543 B2 | 7/2007 | Oh et al. |
| 7,889,538 B2 | 2/2011 | Toda |
| 8,116,117 B2 | 2/2012 | Cho et al. |
| 8,144,507 B2 | 3/2012 | Kim et al. |
| 8,243,493 B2 | 8/2012 | Toda |

(Continued)

FOREIGN PATENT DOCUMENTS

| | | |
|---|---|---|
| JP | 4468414 B1 | 3/2010 |
| KR | 10-0624298 | 9/2006 |
| KR | 100944328 B1 | 2/2010 |

*Primary Examiner* — Ly D Pham
(74) *Attorney, Agent, or Firm* — Volentine & Whitt, PLLC

(57) ABSTRACT

A method of sensing multi-bit data stored in a resistive memory cell includes; determining a resistive value range for the memory cell by performing a first read operation using a first read voltage and a first reference current, determining whether the multi-bit data stored in the resistive memory cell has a first program state, upon determining that the multi-bit data stored does not have the first program state, selecting a second read voltage different from the first read voltage in response to the resistive value range of the resistive memory cell, and using the second read voltage to again determine whether the multi-bit data stored in the resistive memory cell has the first program state.

20 Claims, 14 Drawing Sheets

(56) References Cited

U.S. PATENT DOCUMENTS

| | | |
|---|---|---|
| 8,315,082 B2 | 11/2012 | Toda |
| 8,513,768 B2 | 8/2013 | Bertin et al. |
| 9,030,861 B2 * | 5/2015 | Yon ............... G11C 13/004 365/148 |
| 2009/0303785 A1 * | 12/2009 | Hwang ............ G11C 5/147 365/163 |
| 2009/0323403 A1 * | 12/2009 | Chen ............... G11C 11/1673 365/158 |
| 2010/0110760 A1 * | 5/2010 | Chen ............... G11C 11/16 365/148 |
| 2013/0163321 A1 | 6/2013 | Lam et al. |
| 2013/0326296 A1 * | 12/2013 | Choi ............... G11C 29/50004 714/721 |
| 2014/0140148 A1 * | 5/2014 | An ................. G11C 11/5642 365/189.14 |
| 2014/0211540 A1 * | 7/2014 | Papandreou ....... G11C 29/021 365/148 |

* cited by examiner

FIG. 12

| RCELL | ICELL Convectional | ICELL | VREAD Convectional | VREAD | S/W Convectional | S/W | S/W Improved rate |
|---|---|---|---|---|---|---|---|
| 500kΩ | 8.36 μA | 8.69 μA | 1.5V | 1.5V | 3.40 μA | 3.40 μA | 0% |
| 100kΩ | 5.29 μA | 5.29 μA | | | | | |
| 200kΩ | 3.04 μA | 4.80 μA | 1.5V | 2.0V | 1.36 μA | 2.19 μA | +61.0% |
| 400kΩ | 1.68 μA | 2.61 μA | | | | | |
| 800kΩ | 0.90 μA | 3.64 μA | 1.5V | 2.8V | 0.43 μA | 1.77 μA | +311.6% |
| 1.6MkΩ | 0.47 μA | 1.87 μA | | | | | | ary
NONVOLATILE MEMORY DEVICE HAVING RESISTIVE MEMORY CELL AND METHOD SENSING DATA IN SAME

CROSS-REFERENCE TO RELATED APPLICATIONS

This U.S. non-provisional patent application claims priority under 35 U.S.C. §119 to Korean Patent Application No. 10-2014-0020607, filed on Feb. 21, 2014, the subject matter of which is hereby incorporated by reference.

BACKGROUND

The inventive concept relates generally to nonvolatile memory devices and methods of sensing data in same.

The demand for semiconductor memory devices capable of random data access while also providing high memory cell integration and high data storage capacity continues to increase. In this context, flash memory is mainly used in portable electronic devices as a replacement for conventional dynamic random access memory (DRAM). Other possible replacements include the ferroelectric RAM (FRAM) using a ferroelectric capacitor, the magnetic RAM (MRAM) using a tunneling magneto-resistive (TMR) film, and the phase-change memory device using chalcogenide alloys. The phase-change memory device provides a type of resistive memory cell that is relatively simple to manufacture and may be realized in large-capacity memory device at low cost.

SUMMARY

Embodiments of the inventive concept provide a nonvolatile memory device comprising; a memory cell array including a resistive memory cell capable of being programmed in accordance with a variable resistance value, a sense amplifier configured to discriminate data stored in the resistive memory cell using a read voltage and a reference current, and a sensing control circuit configured to determine during a first read operation a resistance value range of the resistive memory cell using an initial read voltage as the read voltage, adjust a level of the initial read voltage based on the resistance value of the resistive memory cell to generate an adjusted read voltage, and thereafter, sense data stored in the resistive memory cell using the adjusted read voltage.

Embodiments of the inventive concept provide a method of sensing data stored in a resistive memory cell of a nonvolatile memory device. The method comprises; performing a first read operation on the resistive memory cell using a read voltage and a reference current, determining a resistance value range of the resistive memory cell using the first read operation, changing respective levels of the read voltage and reference current in response to the determined resistance value range, and performing a second read operation on the resistive memory cell using the changed read voltage and changed reference current.

Embodiments of the inventive concept provide a method of sensing multi-bit data stored in a resistive memory cell of a nonvolatile memory device according to a first program state and a second program state. The method comprises; determining a resistive value range for the resistive memory cell by performing a first read operation on the resistive memory cell using a first read voltage and a first reference current, determining whether the multi-bit data stored in the resistive memory cell has the first program state, upon determining that the multi-bit data stored in the resistive memory cell does not have the first program state, selecting a second read voltage different from the first read voltage in response to the resistive value range of the resistive memory cell, and using the second read voltage to again determine whether the multi-bit data stored in the resistive memory cell has the first program state.

BRIEF DESCRIPTION OF THE DRAWINGS

Embodiments of the inventive concept will be described below in more detail with reference to the accompanying drawings.

FIG. 12 is a table illustrating a simulation result of a sensing method in accordance with some embodiments of the inventive concept.

DETAILED DESCRIPTION

Embodiments of inventive concept will now be described in some additional detail with reference to the accompanying drawings. The inventive concept may, however, be embodied in many different forms and should not be construed as being limited to only the illustrated embodiments. Rather, these embodiments are provided so that this disclosure will be thorough and complete, and will fully convey the scope of the inventive concept to those skilled in the art. Throughout the written description and drawings, like reference numbers and labels are used to denote like or similar elements.

Figure 1:
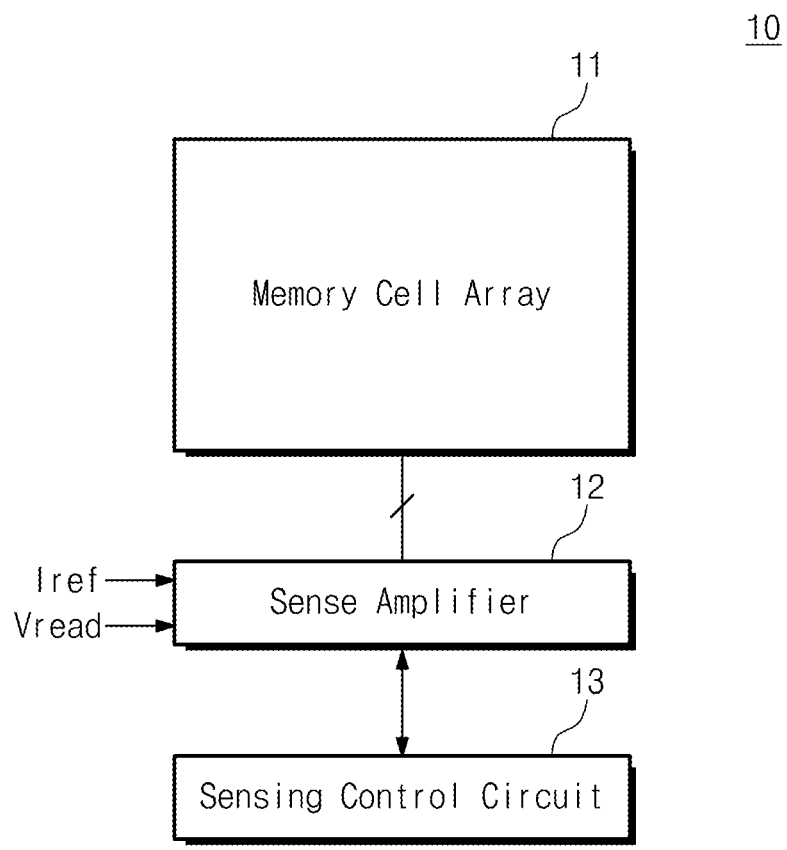
FIG. 1 is a block diagram illustrating a nonvolatile memory device in accordance with some embodiments of the inventive concept.

FIG. 1 is a block diagram illustrating a nonvolatile memory device 10 according to certain embodiments of the inventive concept. Referring to FIG. 1, the nonvolatile memory device 10 comprises; a memory cell array 11, a sense amplifier 12 and a sensing control circuit 13.

During a read operation, the nonvolatile memory device 10 may change a read voltage (Vread) and a reference current (Iref) applied to the memory cell array 11 in response to the resistance value of a selected memory cell. As a result, the nonvolatile memory device 10 may more accurately sense data stored in the memory cell array 11.

Figure 2:
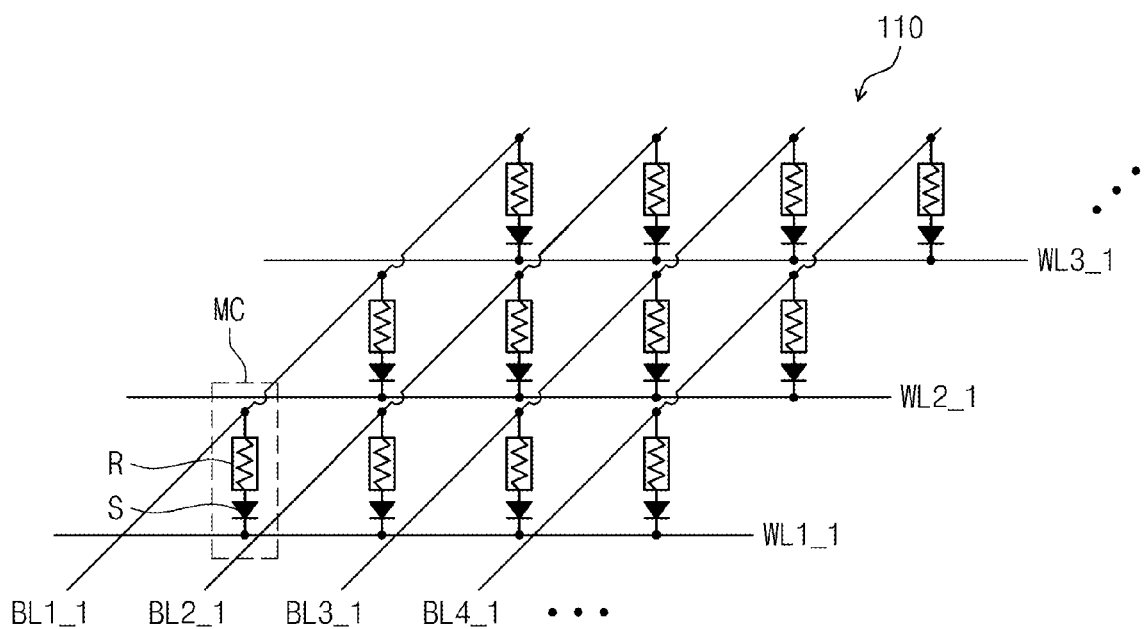
FIG. 2 is a drawing illustrating an embodiment of a memory cell array of FIG. 1.
Figure 3:
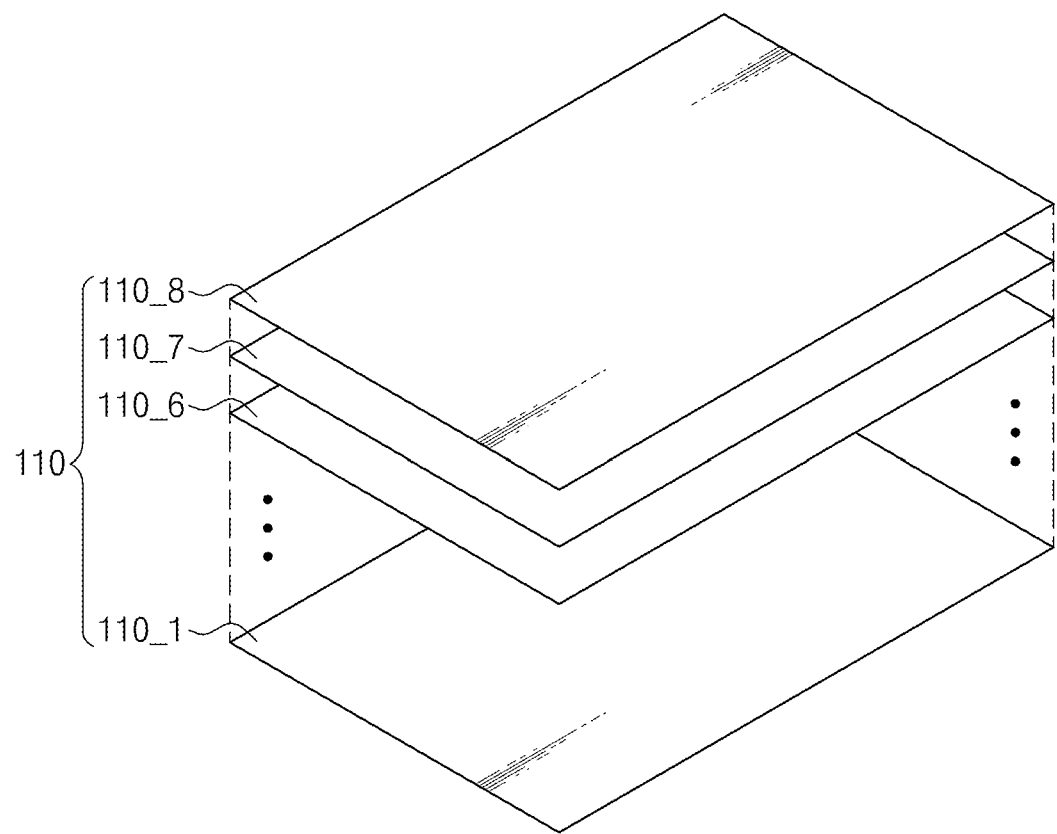
FIG. 3 is a drawing illustrating another embodiment of a memory cell array of FIG. 1.

In its operation, the memory cell array 11 is essentially a plurality of nonvolatile memory cells arranged in a matrix of word lines and bit lines, wherein each memory cell includes a switching element and a resistor element. The switching element may be embodied using various elements such as a Metal Oxide Semiconductor (MOS) transistor, a diode, etc. The resistor element may be embodied from one or more phase-changeable film(s), such those conventionally fabricated using a Germanium-Antimony-Tellurium (GST) material. One possible embodiment of the memory cell array 11 as well as a constituent memory cell are illustrated in FIGS. 2 and 3.

The sense amplifier 12 senses data recorded in a selected memory cell. The sense amplifier 12 amplifies the sensed data to convert it into a binary logical value. The sense amplifier 12 may output the converted data to a buffer.

The sense amplifier 12 may be used provide the externally-provided reference current (Iref) and read voltage (Vread) to the memory cell array 11 during a read operation. For example, the sense amplifier 12 may provide the read voltage to a data line connected to the memory cell array 11 in order to read data stored in a selected memory cell. In certain embodiments of the inventive concept, the read voltage is provided at a sufficiently low level (e.g., a level lower than a given threshold level of the selected memory cell), such that the resistance value of the selected memory cell is not changed as the result of read voltage provision.

The sense amplifier 12 may also be used to compare the level of the reference current with a current induced in the data line as the result of the provision of the read voltage to the selected memory cell. In accordance with this current level comparison, the sense amplifier 12 may determine a logical value for the data written to the selected memory cell. Since the practical range of the read voltage level is limited, it follows that the greater the resistance value of the selected memory cell, the smaller the corresponding read sensing window (or "read sensing margin") will be for reading the data stored in the selected memory cell.

In certain embodiments of the inventive concept, the sensing control circuit 13 is used to control the operation of the sense amplifier 12. Thus, the sensing control circuit 13 may be used to control the respective levels of the reference current and read voltage provided to the sense amplifier 12. The sensing control circuit 13 may be used to determine a "resistance value range" for the selected memory cell on the basis of the comparison result provided by the sense amplifier 12. And the sense control circuit 13 may be used to control the respective levels of the reference current and read voltage being provided to the sense amplifier 12 on the basis of the resistance value range.

The greater the resistance value of the selected memory cell, the higher the level of its threshold voltage. Thus, even if a relatively high read voltage is provided to the selected memory cell having a relatively high resistance value, its threshold voltage will not change nearly as much as comparable changes in the threshold voltage of a memory cell having relatively low resistance value. So, as the resistance value of a selected memory cell increases, the sensing control circuit 13 should desirably increase the level of the read voltage applied during a read operation in order to obtain an acceptable read sensing margin.

In order to accurately read data stored in a selected memory cell, a plurality of read operations may be successively performed. That is, the sensing control circuit 13 may be used to determine a "resistance value range" for the selected memory cell during a first (or "resistance range determining") read operation. In response to the resistance value range obtained by the resistance range determining read operation, the sensing control circuit 13 may appropriately define the respective levels of the reference current (Iref) and read voltage (Vread) provided to the sense amplifier 12 during a subsequently-performed second read operation. In this manner, for example, the sensing control circuit 13 may be used to control the level of the read voltage in view of the resistance value range of the selected memory cell, as determined by the resistance range determining read operation. Thus, if the resistance value range of the selected memory cell is relatively high, a correspondingly high-level read voltage may be applied to the selected memory cell during the second read operation.

In this manner, the nonvolatile memory device 10 of FIG. 1 may dynamically change the respective levels of both a read voltage and a reference current provided to the memory cell array 11 on the basis of a resistance value range identified in relation to a selected memory cell using the sensing control circuit 13. As a result, the nonvolatile memory device 10 may accurately sense data during execution of the read operation described above, while at the same time, not inadvertently changing the value of data stored in the memory cell array 11.

FIG. 2 is a circuit drawing illustrating in part one possible example of a memory cell array 110 that may be used in the nonvolatile memory device of FIG. 1. Referring to FIG. 2, the memory cell array 110 is assumed to have a cross-point structure, wherein each memory cell is disposed in an area proximate the crossing of a word line (WL) and a bit line (BL). For example, respective memory cells (MC) are disposed at areas where bit lines BL1_1~BL4_1 and word lines WL1_1~WL3_1 cross.

In FIG. 2, each memory cell (MC) includes a resistor element (R) and a switching element (S). A resistor element may have a resistance value that varies in accordance with a "write current" applied to it during a previously performed write operation. The data stored by a memory cell may be detected or "sensed" on the basis of this previously-programmed resistance value for the resistor element.

Assuming the use of certain types of phase-change, nonvolatile memory cells, the particular phase of phase change material(s) included in the resistor element may be changed according to the amplitude (level), duration and a rising/falling time of an applied write voltage or write current pulse.

Under this assumption, the constituent phase-change material will manifest a resistance value that varies according to one or more material property state(s). For example, a relatively amorphous material state for the phase-change material may exhibit a very different resistance value in response to an applied read voltage than a relatively crystalline material state for the phase-change material.

FIG. 3 is a perspective drawing further illustrating in one example a three-dimensional laminated structure that may be used to implement the memory cell array 110 of FIG. 2. The exemplary three-dimensional laminated structure includes multiple, vertically stacked, memory cell layers 110_1~110_8. However, those skilled in the art will understand that the number of vertically stacked memory cell layers is an arbitrary one.

Each of the memory cell layers includes multiple memory cell groups and/or multiple groups of redundancy memory cells. In certain embodiments of the inventive concept including a three-dimensional memory cell array, each constituent memory cell layers 110_1~110_8 may have the same cross point structure described in the context of FIG. 2.

Figure 4:
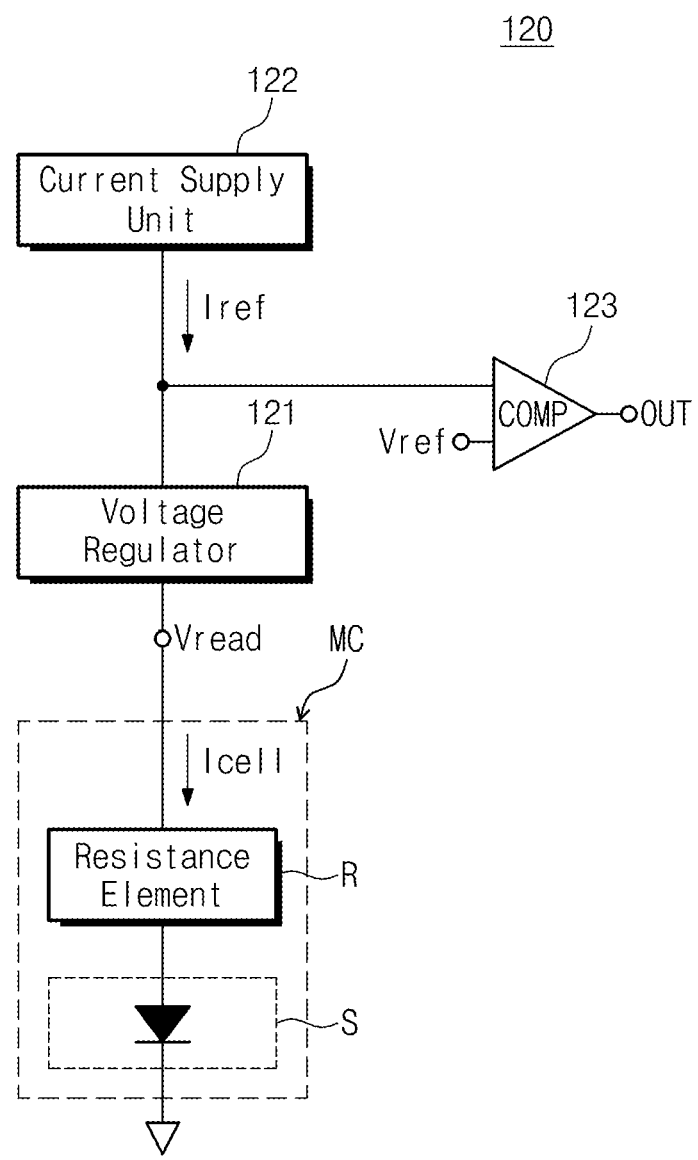
FIG. 4 is a block diagram for explaining a method of sensing data stored in a memory cell of FIG. 2.

FIG. 4 is a block diagram illustrating one approach to the use of a sense amplifier 120 in the nonvolatile memory cell 10 of FIGS. 1 and 2. That is, data stored in a memory cell (MC) may be sensed using the operative combination of a voltage regulator 121, a current supply unit 122 and a comparator 123.

Here, consistent with the description of the memory cell in FIG. 2, the resistor element (R) is used to store data as the result of a previously-performed write (or program) operation. The switching element (S) (here, assumed to be a diode) is connected between one end of the resistor element (R) and a word line.

The voltage regulator 121 may be used to limit the level of a read voltage applied to the memory cell MC, so that it does not stray above a critical "threshold voltage level". This threshold voltage level is one at which some property of the material used to implement the resistance element is changed, thereby changing the corresponding resistance value. Thus, during execution of a read operation directed to the memory cell and by operation of the voltage regulator 121, the level of the read voltage (Vread) applied across the resistor element (R) will remain less than the defined threshold voltage level. In this manner, the voltage regulator 121 prevent the selected memory cell (and/or memory cells surrounding the selected memory cell) from becoming destructively read by controlling the level of the read voltage provided to the selected memory cell, such that it remains less than a critical threshold voltage level.

As also shown in FIG. 4, the current supply unit 122 may be used to generate and provide the reference current (Iref) to a data line connected with the selected memory cell (MC). A cell current (Icell) passing through the memory cell results from a relationship between the applied read voltage (Vread) and the resistance value of the memory cell. The comparator 123 may be used to compare the reference current (Iref) with the cell current (Icell) in order to discriminate the value of data stored in the memory cell.

Here, the level of the cell current flowing through the memory cell during a read operation may be calculated as:

$$Icell = \frac{Vread - Vdiode}{Rcell},$$

where "Rcell" is the resistance value of the memory cell and "Vdiode" is a voltage provided to an upper end of the switching element. Referring to this mathematical relationship, as the resistance value Rcell of the memory cell increases, the cell current flowing through the memory cell decreases. Thus, for example in a memory cell used to store multi bit data, the provided sensing margins associated with each respective data state corresponding to a particular logical value may be faithfully discriminated one from the other.

Figure 5A:
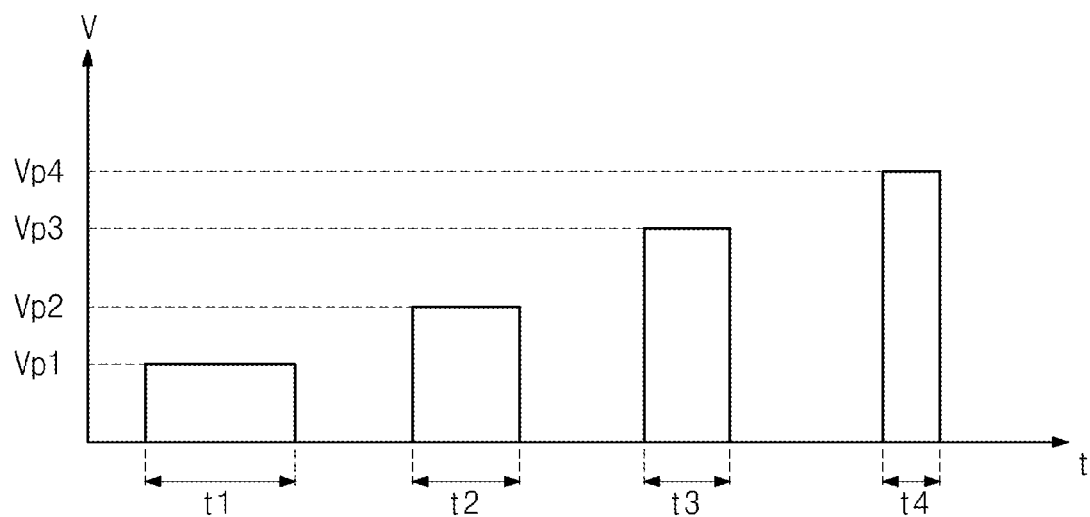
FIG. 5A is a graph illustrating a program pulse being provided to program a plurality of bits in a memory cell of FIG. 2.

FIG. 5A is a graph illustrating a set of exemplary program pulses that may be provided during the programming of multi-bit data to a memory cell in the memory cell array of FIG. 2. That is, the graph of FIG. 5A illustrates a relationship between the level of program voltage pulses applied to a memory cell over time during a write operation.

Figure 5B:
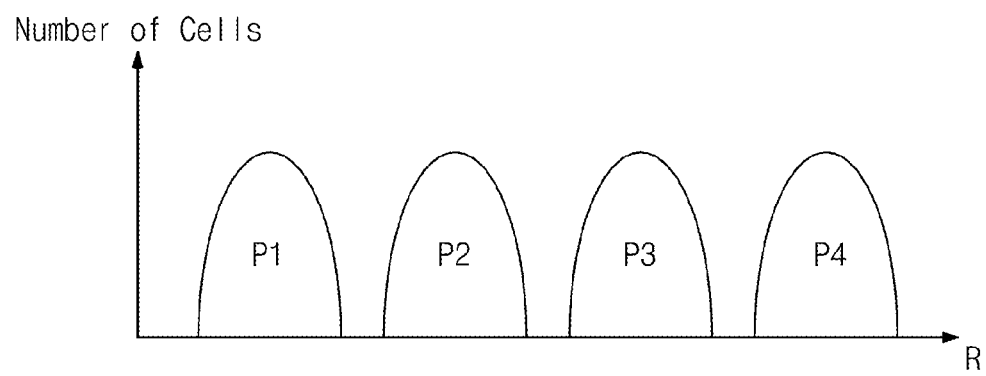
FIG. 5B is a graph illustrating a distribution of resistances of a memory cell formed by the program pulse illustrated in FIG. 5A.

FIG. 5B is a graph illustrating one possible distribution for the memory cell resistances that may be formed by the program pulses of FIG. 5A.

Again with reference to FIG. 2, the resistance value of the memory cell will change in response to the level and applied duration of a voltage pulse. For example, a high voltage applied over a short duration will increase the relatively amorphous state of certain phase-change materials included in the resistor element of the memory cell. And as the amorphous volume of the resistor element increases, the resistance value of the memory cell will also increase.

In FIG. 5B, a horizontal axis indicates increasing resistance and a vertical axis indicates a number of memory cells. Referring to FIG. 5B, a memory cell may be programmed according to one of many program states corresponding to the program pulses of FIG. 5A. Thus, a first program voltage Vp1 may be applied for a first time t1 in order to program the memory cell to a first state P1; a second program voltage Vp2 may be applied for a second time t2 in order to program the memory cell to a second state P2; and so on through all four (4) program states illustrated in FIGS. 5A and 5B.

Figure 6A:
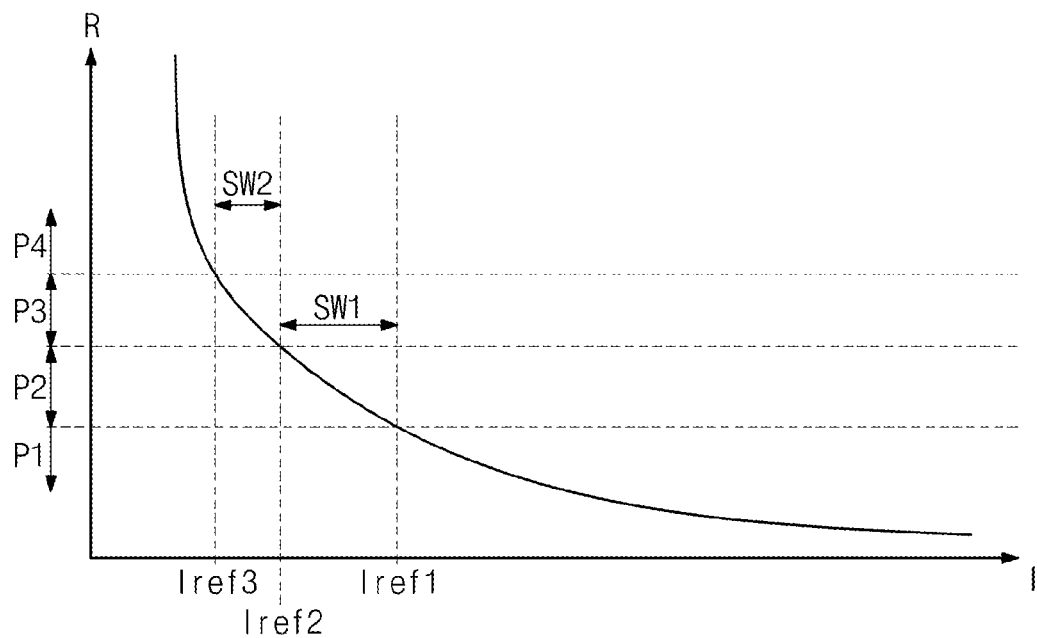
FIGS. 6A and 6B are drawings for explaining different sensing margins of program states illustrated in FIG. 5B.
Figure 6B:
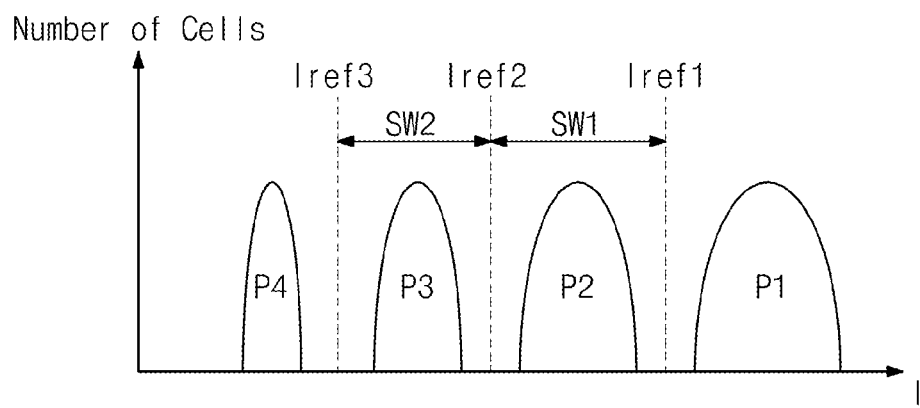

In the context of the programming example described in accordance with FIGS. 5A and 5B, FIGS. 6A and 6B illustrate the different read sensing margins that result from the programming approach of FIGS. 5A and 5B. Thus, in FIG. 6A, the horizontal axis indicates cell current when a read voltage is applied and the vertical axis indicates the resistance value of the memory cell. In FIG. 6B, the horizontal axis indicates cell current when the read voltage is applied and the vertical axis indicates a number of memory cells.

Referring collectively to FIGS. 5A, 5B, 6A and 6B, when the read voltage (Vread) is applied to a memory cell having a relatively high resistance value range, the resulting cell current is relatively low. Hence, when the read voltage is applied to a selected memory cell that passes a cell current greater than a first reference current (Iref1), the memory cell is determined to be programmed to the first state P1. When the read voltage is applied to a selected memory cell that passes a cell current less than the first reference current but greater than a second reference current (Iref2), the memory cell will be determined to be programmed to the second state P2. And when the read voltage is applied to selected memory cell that passes a cell current less than the second reference current but greater than a third reference current (Iref3), the memory cell is determined to be programmed to the third state P3.

From FIGS. 6A and 6B it may be understood that as the resistance value of a memory cell increases, the cell current level rapidly decreases, thereby narrowing the resulting read sensing window associated with each program state for the memory cell. That is, according to the illustrated example of FIGS. 6A and 6B, a second sensing window (SW2) during which the third state P3 is sensed in markedly more narrow than a first sensing window (SW1) during which the second state P2 having a resistance value lower than that of the third state P3 is sensed.

Figure 7:
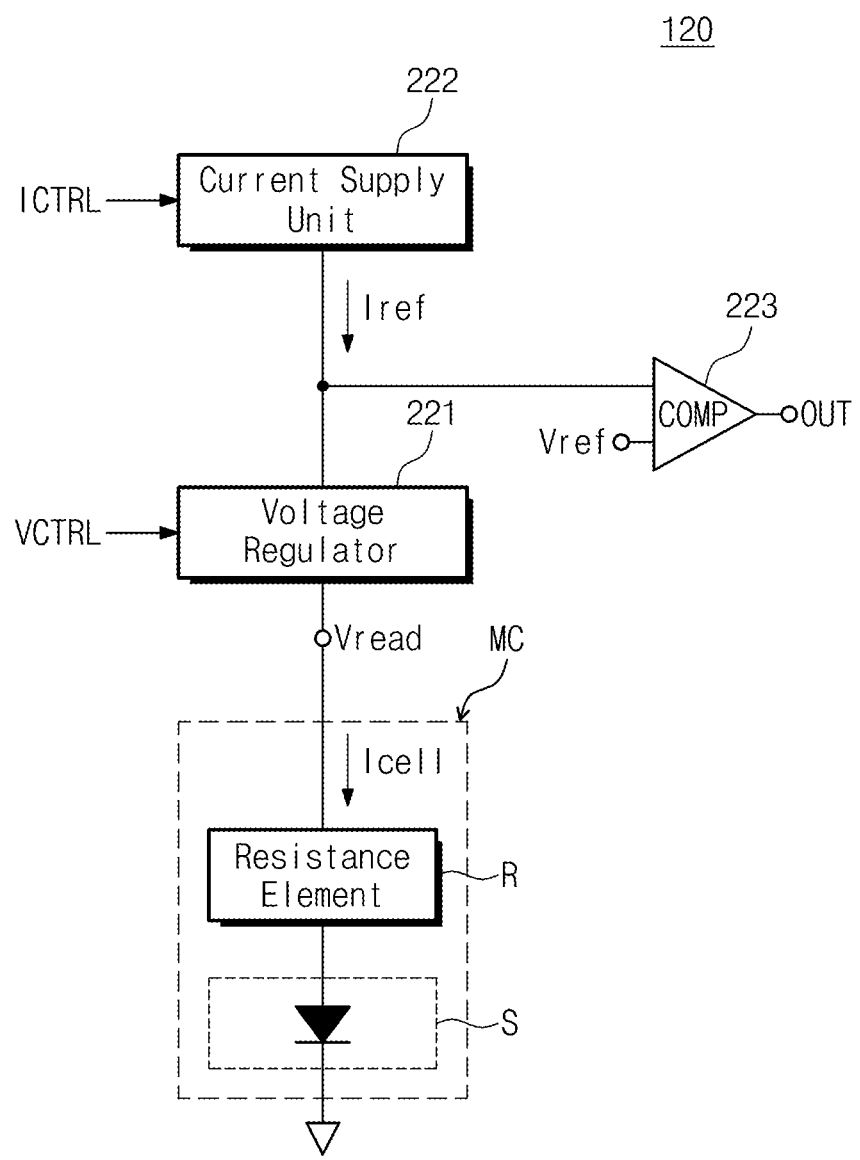
FIG. 7 is a block diagram for explaining another method of sensing data stored in a memory cell of FIG. 2.

FIG. 7 is a block diagram illustrating another approach to the use of the sense amplifier 120 in the nonvolatile memory cell 10 of FIGS. 1 and 2. As before, the sense amplify unit 120 may be used to improve read sensing margins with respect to program state(s) associated with high resistance value(s). This may be accomplished by sensing a memory cell using a relatively high level read voltage when it is first determined that the memory cell has a relatively high resistance value, or sensing the memory cell using a relatively low level read voltage when it is first determined that the memory cell has a relatively low resistance value.

Data stored in the memory cell MC is sensed using a voltage regulator 221, a current supply unit 222 and a comparator 223 included in the sense amplify unit 120.

The voltage regulator 221 limits the level of a read voltage (possibly among a plurality of read voltages) applied to the memory cell (MC) in response to a voltage control signal (VCTRL) received from (e.g.,) the sensing control circuit 13.

The current supply unit 222 delivers (e.g.,) an externally-provided reference current (Iref) to a data line connected to the memory cell in response to a current control signal (ICTRL) received from (e.g.,) the sensing control circuit 130. In this regard, the current supply unit 222 may deliver a reference current selected among a predetermined plurality of reference currents in response to the current control signal. A cell current (Icell) is then generated according to a relationship between the applied read voltage and the resistance value of the memory cell. The comparator 223 may also be used to compare the reference current with the cell current to discriminate the data stored by the memory cell.

As described above, the voltage regulator 221 and the current supply unit 222 may change the level of an applied read voltage (Vread) and/or the level of the reference current (Iref) during a read operation executed under the control of the sensing control circuit 130.

Figure 8:
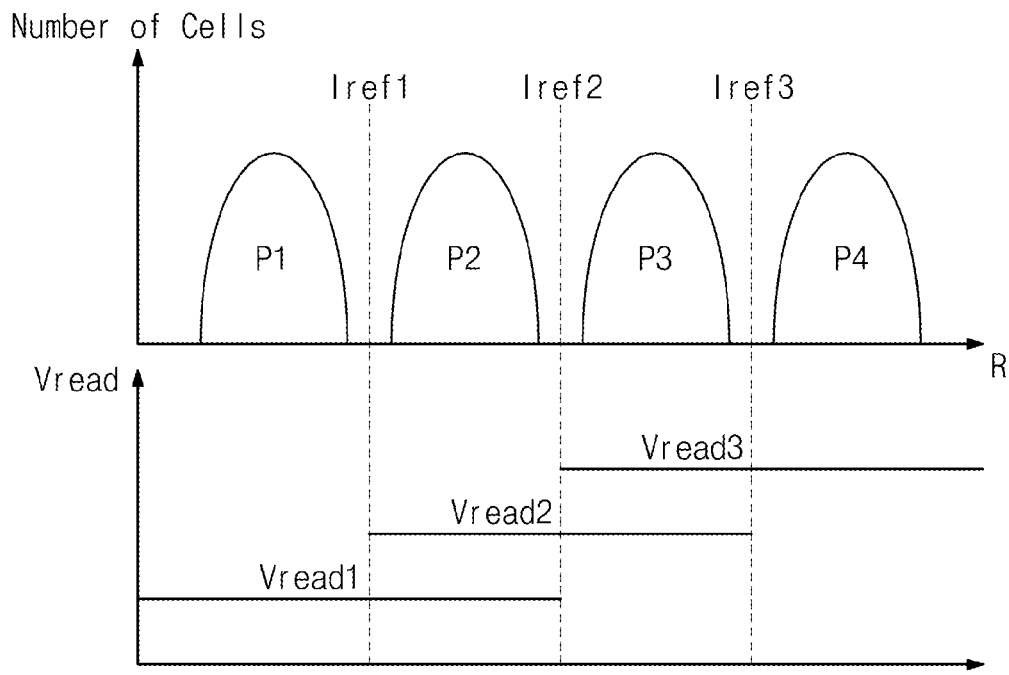
FIG. 8 is a drawing illustrating an embodiment of a sensing method of FIG. 7.

FIG. 8 is a set of related drawings further illustrating in one example the data sensing approach of FIG. 7. Referring to FIG. 8, the selected memory cell is assumed to store 2-bit data.

A plurality of read operations may be performed to sense data stored in the memory cells. During each read operation, the level of one or more associated read voltage(s) and/or reference current(s) being provided to the memory cell may be changed on the basis of a predetermined resistance value for the memory cell.

Thus, during a first read operation, a first read voltage (Vread1) is applied to selected memory cell(s). Here, the first read voltage will be less than a first threshold voltage level for a memory cell having a lowest resistance value among memory cells programmed to the first state P1. A first reference current (Iref1) is compared with cell current flowing through the selected memory cell(s) in response to the provision of the first read voltage. And the programmed state of the selected memory cell(s) may be determined on the basis of this comparison. So, when the cell current is less than the first reference current, a second read operation is performed.

During the second read operation, a second read voltage (Vread2) is applied to the selected memory cell(s). Here, the second read voltage is less than a second threshold voltage level for a memory cell having a lowest resistance value among memory cell(s) programmed to the second state P2, where the second read voltage is higher than the first read voltage. A second reference current (Iref2) is compared with cell current flowing through the selected memory cell(s) in response to the provision of the second read voltage. And the programmed state of the selected memory cell(s) may be determined on the basis of this comparison. So, when the cell current is less than the second reference current, a third read operation is similarly performed with a third read voltage (Vread3) and a third reference current (Iref3).

Of note, the respective levels of the read voltages and reference currents applied to the selected memory cell(s) during each read operation will be changed on the basis of a predetermined resistance value for at least one of the selected memory cell(s). In this manner, read sensing margins may be improved without changing the resistance value of the selected memory cell(s) by providing a relatively high level read voltage during a read operation directed to a selected memory cell having a relatively high resistance value.

Figure 9:
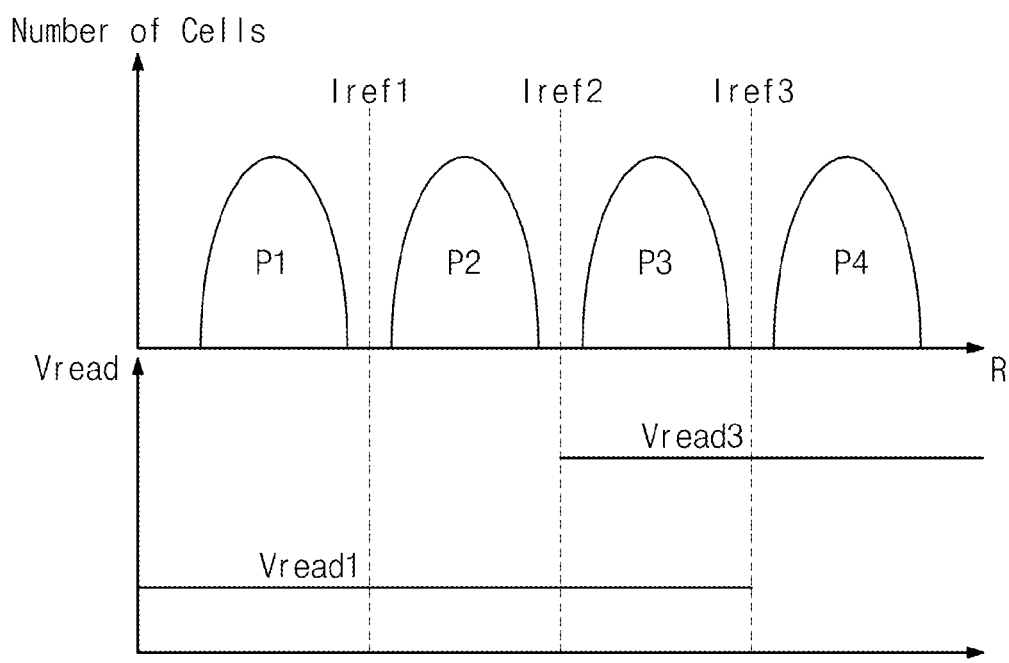
FIG. 9 is a drawing illustrating an embodiment of another sensing method of FIG. 7.

FIG. 9 is a set of related drawings further illustrating in another example the sensing method of FIG. 7. The memory cells are again assumed to store 2-bit data.

During a first read operation, a first read voltage (Vread1) is applied to selected memory cell(s), where the first read voltage has a level less than a threshold voltage level for a memory cell having a lowest resistance value among the selected memory cell(s) programmed to the first state P1.

A first reference current (Iref1) is compared with a cell current passing the selected memory cell(s) in response to the first read voltage. Hence, a resistance value range for the selected memory cell(s) may be determined on the basis of the comparison. When the cell current passing the selected memory cell(s) is greater than the first reference current, a second read operation is performed, and when the cell current passing the selected memory cell(s) is less than the first reference current, a third read operation is performed.

During the second read operation, the first read voltage is again applied to the selected memory cell(s). Cell current passing through the selected memory cell(s) is compared with a second reference current (Iref2) and it may be determined whether the selected memory cell(s) are programmed to the first state P1 or the second state P2 on the basis of a comparison.

During a third read operation, a third read voltage (Vread3) is applied to the selected memory cell(s), where the third read voltage has a level less than a threshold voltage level for a memory cell having the lowest resistance value among memory cells programmed to the third state P3, and the level of the third read voltage is higher than the level of the first read voltage.

A third reference current (Iref3) is compared with a cell current passing through the selected memory cell(s) in response to the third read voltage, and based on the comparison it may be determined whether the selected memory cell(s) are programmed to the third state P3 or the fourth state P4.

Thus, as described above, the respective levels of the read voltage and reference current applied to selected memory cell(s) during a read operation may be changed on the basis of a detected resistance value range for the selected memory cell(s). That is, according to certain embodiments of the inventive concept, a range of resistance values for a selected memory cell may be determined using the results of a first read operation. Then, with this resistance value range information, the level of one or more read voltage(s) and/or the level of one or more reference current(s) applied during a second read operation may be determined, where the level of each read voltage is defined in such a manner that it does not exceed a threshold voltage level for a memory cell having a lowest resistance value for memory cells programmed to a particular state.

Using this approach, read sensing margin(s) may be improved without necessarily changing the resistance value of the selected memory cell(s). Instead, a variable level read voltage may be defined for use during a read operation that takes into consideration the resistance value of the selected memory cell(s).

Figure 10:
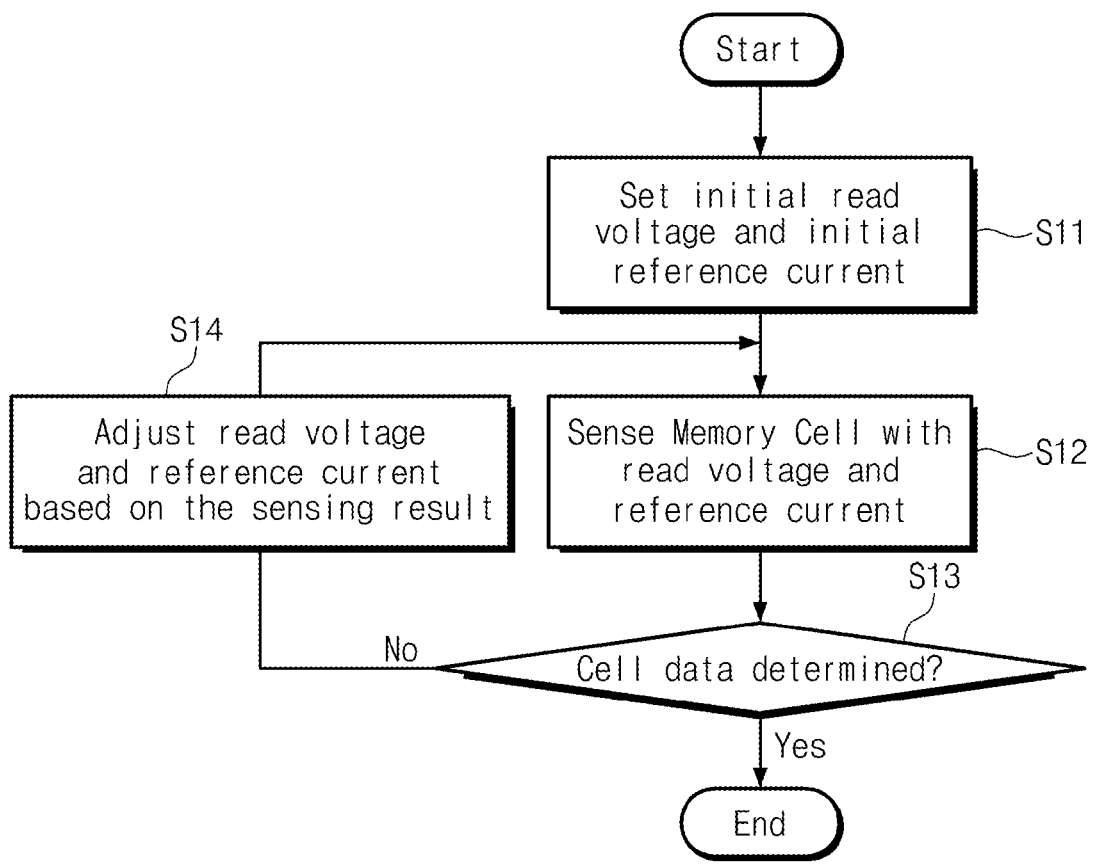
FIG. 10 is a flow chart illustrating a method of sensing a memory cell in accordance with some embodiments of the inventive concept.

FIG. 10 is a flow chart summarizing a method of sensing memory cell data in accordance with embodiments of the inventive concept. Using this approach, a read sensing margin may be improved without changing the resistance value of a selected memory cell.

In the method, an initial read voltage and an initial reference current are set (S11). The initial read voltage should have a level lower than the threshold voltage level of a memory cell having a lowest resistance value relative to a designated program state.

Then, a read operation directed to a selected memory cell may be performed, such that the selected memory cell is sensed, as has been described above using the initial read voltage and initial reference current (S12). That is, a first (or a resistance range determining) read operation is performed by comparing cell current passing through the selected memory cell with the initial reference current in response to applying the initial read voltage.

A determination is now made with respect to certain program data with respect to the selected memory cell (S13). If an additional read operation is required (S13=No), then the read voltage and reference current are adjusted on the basis of the resistance value range of the selected memory cell, as determined by step S12 (S14). The higher resistance value of the selected memory cell, the higher the level of the read voltage, so long as the level of the read voltage remains less than a threshold voltage level of a memory cell having a lowest resistance value during a next read operation, assuming successively performed read operations as described above.

A high level read voltage may be provided while a read operation is performed on a memory cell having a high resistance value. According to the sensing method of the inventive concept, a sensing margin may be improved without changing a resistance value of the memory cell MC.

Figure 11:
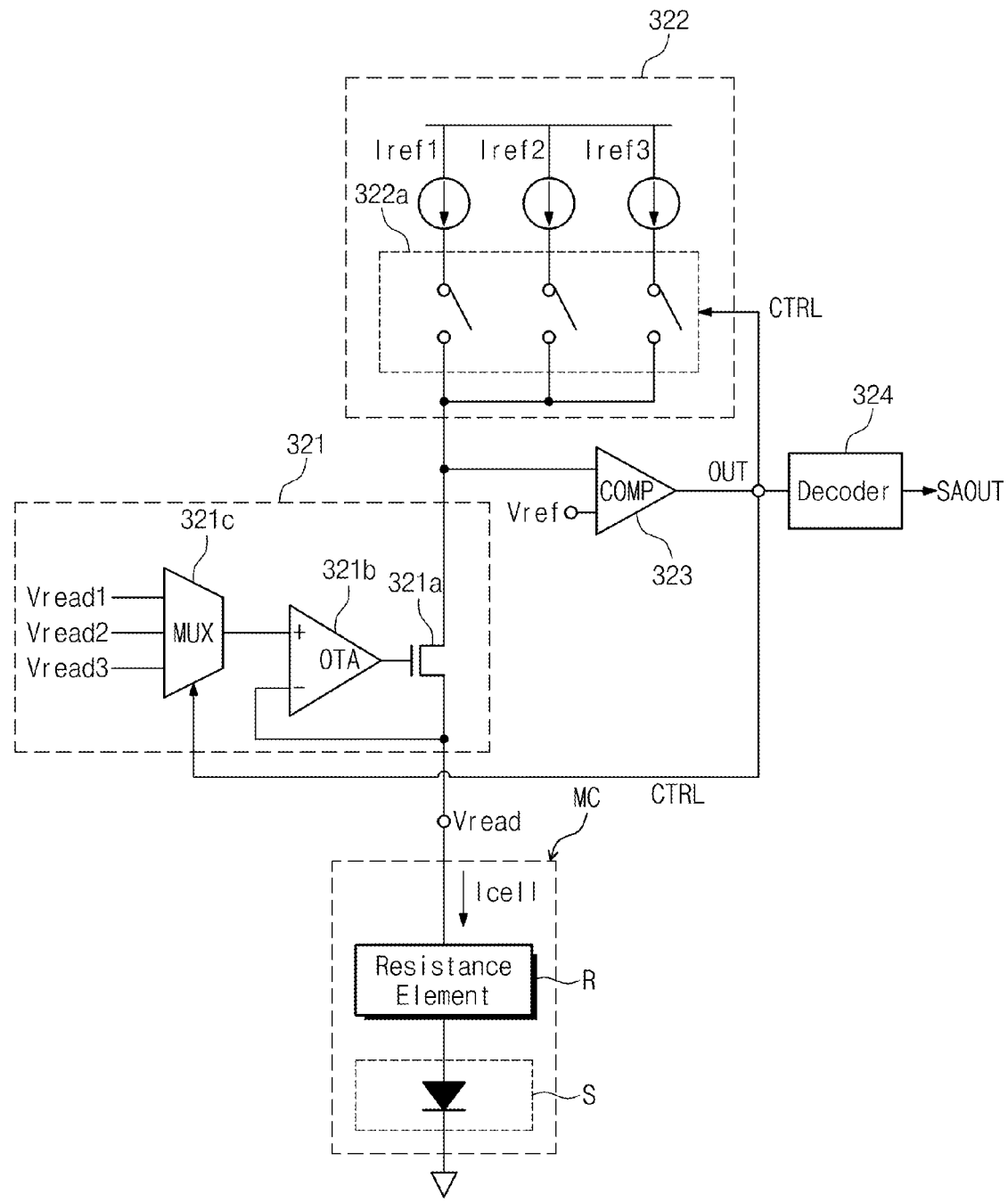
FIG. 11 is a block diagram for explaining still another method of sensing data stored in a memory cell of FIG. 2.

FIG. 11 is a block/circuit diagram illustrating another approach to the use of the sense amplifier 120 in the nonvolatile memory cell 10 of FIGS. 1 and 2. The results of a first read operation is fed back to the sense amplifier unit 120 of FIG. 11, so that the sense amplifier unit 120 may be used to change the respective levels of a read voltage and a reference current to-be-used during a second read operation.

In FIG. 11, data stored in the memory cell is sensed using a voltage regulator 321, a current supply unit 322 and a comparator 323 included in the sense amplifier unit 120.

As before, the voltage regulator 321 may be used to limit the level of the read voltage being applied to the selected memory cell. For example, the voltage regulator 321 may be provided with a plurality of externally-provided read voltages having different levels (e.g., first, second and third read voltages).

A control signal (CTRL) provided by the comparator 323 is fed back to the voltage regulator 321, and in response to the control signal, the voltage regulator 321 limits the level of the read voltage applied to the selected memory cell, such that it remains below a threshold voltage level.

In the illustrated example of FIG. 11, the voltage regulator 321 includes a pass unit 321a, an amplify unit 321b and a multiplexer unit 321c. The pass unit 321a provides a read voltage (Vread) to the selected memory cell in response to an output by the amplify unit 321b. The pass unit 321a may be used to control the current level being provided to the selected memory cell in response to an output of the amplify unit 321b and the reference current (Iref). The pass unit 321a may be constituted by a transistor.

The amplifier unit 321b receives a read voltage from the multiplexer unit 321c. A voltage output by the pass unit 321a is fed back to the amplifier unit 321b, and the amplifier unit 321b limits the voltage output by the pass unit 321a to a read voltage provided from the multiplexer unit 321c in response to the voltage which was fed back to the amplifier unit 321b.

The multiplexer 321c is provided with a plurality of externally-provided read voltages (e.g., first, second and third read voltages). The control signal from the comparator 323 is fed back to the multiplexer unit 321c, and the multiplexer unit 321c selects one of the plurality of read voltages in response to the control signal. The multiplexer unit 321c then provides the selected read voltage to the amplify unit 321b.

The voltage regulator 321 limits the level of the read voltage being applied to the memory cell such that it remains below the level of the selected read voltage.

The current supply unit 322 includes a plurality of current generators, each generating a reference current (e.g., Iref1, Iref2 and Iref3) and a switching element 322a connected to the reference current generators. The control signal provided by the comparator 323 is fed back to the current supply unit 322, such that the switching element 322a of the current supply unit 322 delivers a selected reference current to a data line connected to the selected memory cell in response to the control signal.

A cell current (Icell) passing through the selected memory cell is generated on the basis of a relationship between the applied read voltage and the resistance value of the memory cell. The comparator 323 compares the reference current with the cell current to determine a resistance value range for the selected memory cell.

The comparator 323 provides a resulting comparison result to the voltage regulator 321 and the current supply unit 322 as the control signal. The comparator 323 also provides the comparison result to the decoder 324. The voltage regulator 321 and current supply unit 322 may be used in this manner to change the level of an applied read voltage and an applied reference current in response to the control signal. The decoder 324 may be used to decode the comparison results provided from the comparator 323 during read operations in order to discriminate data stored in the selected memory cell.

The comparator 323 may effectively be used to generate a binary (HIGH/LOW) comparison result between the cell current and reference current. If the cell current Icell is greater than the reference current Iref, the comparison 323 may output a logical '0', while if the cell current Icell is less than the reference current Iref, the comparison 323 may output a logical '1'.

If the control signal is '0', the voltage regulator 321 will maintain the selected read voltage to protect memory cell(s) having a relatively low resistance state. But, if the control signal is '1', the voltage regulator 321 will increase the level of the read voltage to improve the read sensing margin with respect to memory cell(s) having a relatively high resistance state.

Thus, the information derived by executing the first read operation may be fed back to the sense amplifier unit 120, such that the sense amplifier unit 120 change, as necessary, the level of a read voltage and/or a reference current that will be applied during a subsequent, second read operation.

FIG. 12 is a table listing simulation results for a nonvolatile memory device using a data sensing method in accordance with one embodiment of the inventive concept. In FIG. 12, "RCELL" indicates a resistance value for a memory cell. As the memory cell resistance value increases, the sensing method of the inventive concept is nonetheless able to obtain a wide sensing window, as compared with conventional sensing methods using a read voltage having a fixed level.

Figure 13:
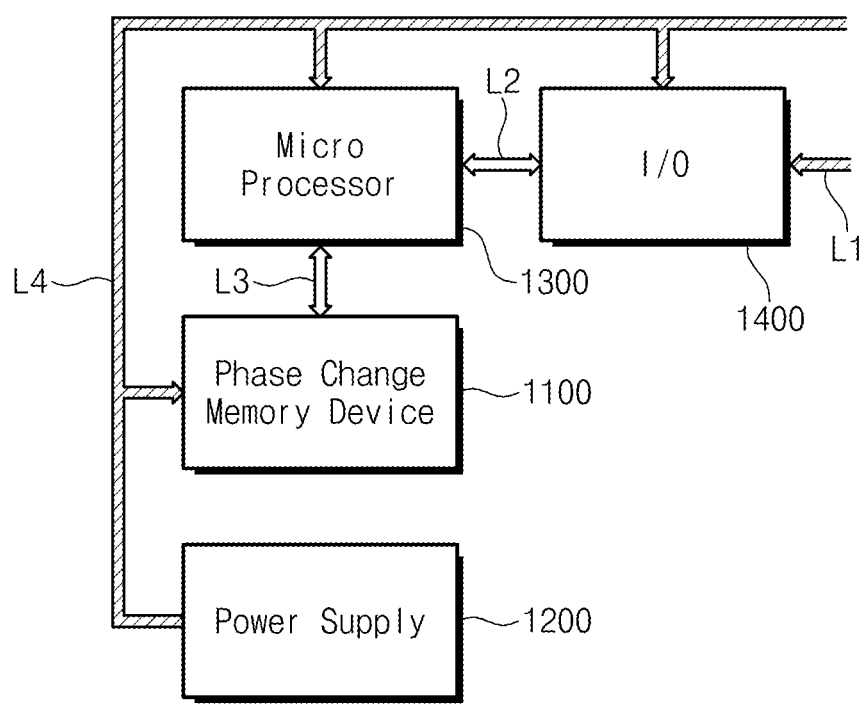
FIG. 13 is a block diagram illustrating an example that a phase change memory device in accordance with some embodiments of the inventive concept is applied to a portable electronic system.

FIG. 13 is a block diagram illustrating in one example a phase change memory device in accordance with certain embodiments of the inventive concept. Here, the phase change memory device is applied to a portable electronic system.

A phase change memory device 1100 may provide a high level read voltage while a read operation is performed on a memory cell having a high resistance value. The phase change memory device 1100 may improve a sensing margin without changing a resistance value of the memory cell.

The phase change memory device 1100 connected to a microprocessor 1300 through a bus line L3 is provided as a main memory of a portable electronic system. A power supply unit 1200 supplies power to the microprocessor 1300, an input/output device 1400 and the phase change memory device 1100 through a power supply line L4. The microprocessor 1300 and the input/output device 1400 may be provided as a memory controller for controlling the phase change memory device 1100.

In the case that received data is provided to the input/output device 1400 through a line L1, the microprocessor 1300 is inputted with the received data through a line L2 to process it and then applies the received or processed data to the phase change memory device 1100 through the bus line L3. The phase change memory device 1100 stores data being applied through the bus line L3 in a memory cell. Data stored in the memory cell is read by the microprocessor 1300 and then is output to the outside through the input/output device 1400.

Even in the case that power of the power supply unit 1200 is not supplied to the power supply line L4, data stored in the memory cell of the phase change memory device 1100 does not go out of existence due to the nature of a phase change material. This is because the phase change memory device 1100 is a nonvolatile memory. The phase change memory device 1100 also has advantages that its operation speed is higher than other memories and its power consumption is low.

Figure 14:
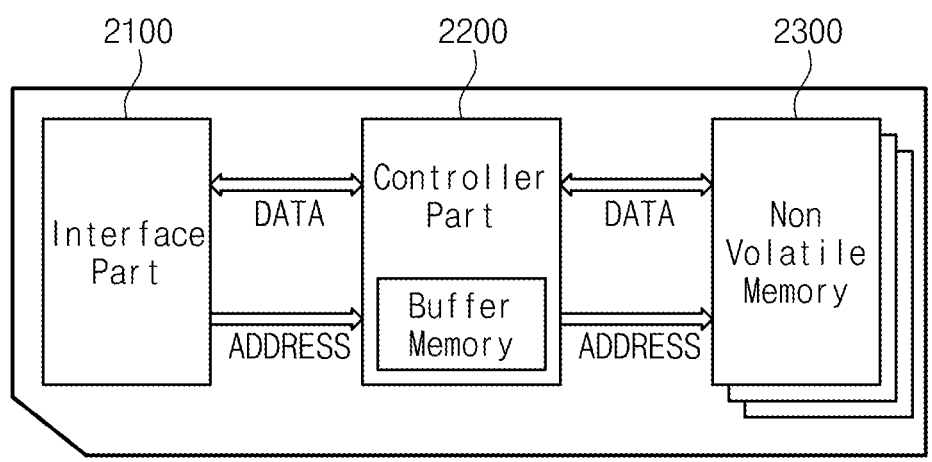
FIG. 14 is a block diagram illustrating an example that a nonvolatile memory device in accordance with some embodiments of the inventive concept is applied to a memory card.

FIG. 14 is a block diagram illustrating a nonvolatile memory device in accordance with embodiments of the inventive concept as applied to a memory card. The memory card 2000 may be, for example, a MMC card, a SD card, a multiuse card, a micro SD card, a memory stick, a compact SD card, an ID card, a PCMCIA card, a SSD card, a chip-card, a smart card, a USB card, etc.

Referring to FIG. 14, the memory card 2000 may include an interface part 2100 performing an interface with the outside, a controller 2200 including a buffer memory and controlling an operation of the memory card 200 and at least one of nonvolatile memory devices 2300. The controller 2200 may control a write operation and a read operation of the nonvolatile memory device 2300 as a processor. The controller 2300 is coupled to the nonvolatile memory device 2300 and the interface part 2100 through a data bus DATA and an address bus ADDRESS.

The nonvolatile memory device 2300 may provide a high level read voltage while a read operation is performed on a memory cell having a high resistance value. The nonvolatile memory device 2300 may improve a sensing margin without changing a resistance value of the memory cell.

Figure 15:
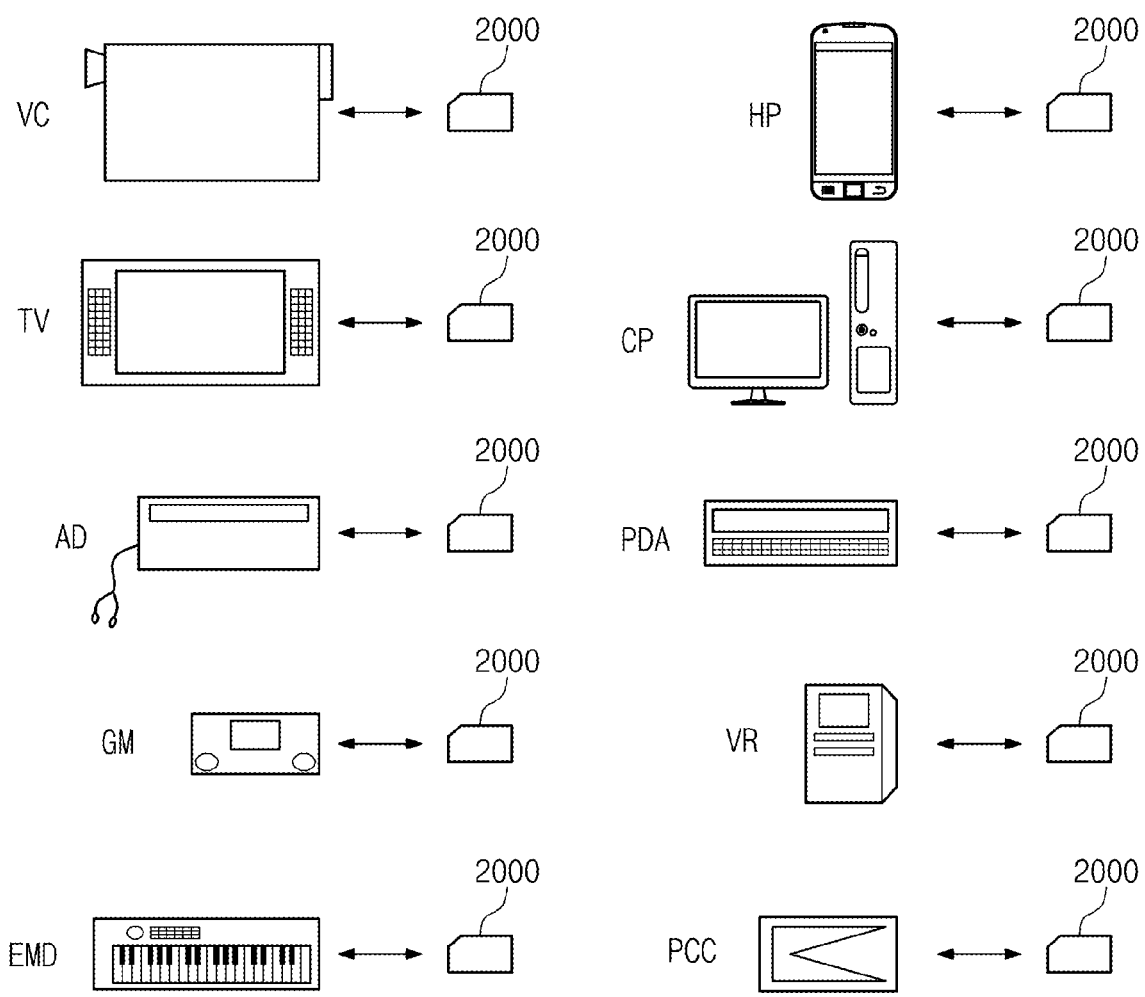
FIG. 15 is a drawing illustrating various systems in which a memory card of FIG. 14 is used.

FIG. 15 is a drawing illustrating various systems in which a memory card of FIG. 14 is used. Referring to FIG. 15, a memory card 2000 may be used in (a) a video camera, (b) a television, (c) an audio device, (d), a game device, (e) an electronic music device, (f) a cellular phone, (g) a computer, (h) a PDA (personal digital assistant), (i) a voice recorder, (j) a PC card, etc.

The nonvolatile memory device in accordance with some embodiments of the inventive concept may be mounted using various types of packages such as package on package (PoP), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flat-pack (TQFP), system in package (SIP), multi chip package (MCP), wafer-level fabricated package (WFP) and wafer-level processed stack package (WSP).

According to the nonvolatile memory device and the method of sensing data in same in accordance with the inventive concept, read sensing margin(s) may be improved even when constituent memory cells of the nonvolatile memory device are used to store multi bit data. In this context, memory cells storing data in accordance with prescribed range(s) of electrical resistances may be termed "resistive memory cells." Certain examples of exemplary resistive memory cells have been presented above. Those skilled in the art will understand that the principles and features of various embodiments of the inventive concept may be applied to other types of resistive memory cells.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited to only the foregoing detailed description.

What is claimed is:

1. A nonvolatile memory device, comprising:
   a memory cell array including a resistive memory cell being programmed in accordance with a variable resistance value;
   a sense amplifier configured to discriminate data stored in the resistive memory cell using a read voltage and a reference current; and
   a sensing control circuit configured to determine during a first read operation a resistance value range of the resistive memory cell using an initial read voltage as the read voltage, adjust a level of the initial read voltage based on the resistance value of the resistive memory cell to generate an adjusted read voltage, and thereafter, sense data stored in the resistive memory cell using the adjusted read voltage,
   wherein as the resistance value of the resistive memory cell increases, the sensing control circuit controls the sense amplifier to increase the level of the adjusted read voltage.

2. The nonvolatile memory device of claim 1, wherein the sense amplifier comprises:
   a voltage regulator configured to provide the adjusted read voltage to the resistive memory cell by selecting the adjusted read voltage from among a plurality of externally-provided read voltages having different levels.

3. A nonvolatile memory device comprising:
   a memory cell array including a resistive memory cell being programmed in accordance with a variable resistance value;
   a sense amplifier configured to discriminate data stored in the resistive memory cell using a read voltage and a reference current; and
   a sensing control circuit configured to determine during a first read operation a resistance value range of the resistive memory cell using an initial read voltage as the read voltage, adjust a level of the initial read voltage based on the resistance value of the resistive memory cell to generate an adjusted read voltage, and thereafter, sense data stored in the resistive memory cell using the adjusted read voltage, wherein the sensing control circuit is further configured to determine during the first read operation the resistance value range of the resistive memory cell using an initial reference current as the reference current, adjust a level of the initial reference current based on the resistance value of the resistive memory cell to generate an adjusted reference current, and thereafter, sense the data stored in the resistive memory cell using the adjusted reference current.

4. The nonvolatile memory device of claim 3, wherein the sensing control circuit controls the sense amplifier such that an upper limit of the adjusted read voltage remains below a threshold voltage level for the resistive memory cell.

5. The nonvolatile memory device of claim 3, wherein the sense amplifier comprises:
a voltage regulator configured to provide the adjusted read voltage to the resistive memory cell by selecting the adjusted read voltage from among a plurality of externally-provided read voltages having different levels; and
a current supply unit configured to provide the adjusted reference current to a data line connected to the resistive memory cell by selecting the adjusted reference current from among a plurality of reference currents having different levels.

6. The nonvolatile memory device of claim 3, wherein the sense amplifier comprises:
a voltage regulator configured to provide the adjusted read voltage to the resistive memory cell by selecting the adjusted read voltage from among a plurality of externally-provided read voltages having different levels;
a current supply unit configured to provide the adjusted reference current to a data line connected to the resistive memory cell by selecting the adjusted reference current from among a plurality of reference currents having different levels; and
a comparator configured to compare cell current passing through the resistive memory cell during the first read operation with the initial reference current and generate a comparison signal.

7. The nonvolatile memory device of claim 6, wherein the sensing control circuit determines the resistance value range of the resistive memory cell in response to the comparison signal.

8. The nonvolatile memory device of claim 7, wherein if the cell current is greater than the initial reference current, the sensing control circuit controls the voltage regulator such that the level of the initial read voltage is maintained.

9. The nonvolatile memory device of claim 7, wherein if the cell current is less than the initial reference current, the sensing control circuit controls the voltage regulator so that a level of the initial read voltage increases to that of the adjusted read voltage.

10. The nonvolatile memory device of claim 6, wherein the voltage regulator comprises:
a multiplexer configured to select the read voltage from among the plurality of externally-provided read voltages;
an amplifier configured to output the read voltage: and
a pass unit connected to an output of the amplifier and configured to apply the read voltage to the memory cell, wherein the amplifier feeds an output of the pass unit back to stabilize the read voltage applied by the pass unit.

11. The nonvolatile memory device of claim 6, wherein the sense amplifier further comprises:
a decoder configured to receive the comparison signal during the first and second read operations and to decode the received comparison signal to discriminate the data stored in the resistive memory cell.

12. A method of sensing data stored in a resistive memory cell of a nonvolatile memory device, the method comprising:
performing a first read operation on the resistive memory cell by comparing a reference current with a cell current passing through the resistive memory cell in response to the read voltage;
determining a resistance value range of the resistive memory cell using the first read operation;
changing respective levels of the read voltage and reference current in response to the determined resistance value range by increasing the read voltage if the cell current is less than the reference current; and
performing a second read operation on the resistive memory cell using the changed read voltage and changed reference current.

13. The method of claim 12, wherein the increasing of the read voltage increases the read voltage to a voltage lower than a threshold voltage of lower bounding of a resistance range in which the resistive memory cell is included.

14. The method of claim 12, wherein the determining of the resistance value range of the memory cell further comprises maintaining the read voltage if the cell current is greater than the reference current.

15. The method of claim 12, further comprising:
determining another resistance value range of the resistive memory cell during the second read operation and changing levels of the read voltage and the reference current on the basis of the another determined resistance range;
performing a third read operation on the memory cell using the changed read voltage and the changed reference current; and
decoding results of the first, second and third read operations to discriminate data stored in the resistive memory cell.

16. The method of claim 12, wherein as the resistance value of the resistive memory cell increases, the level of the adjusted read voltage increases.

17. The method of claim 12, wherein an upper limit of the adjusted read voltage remains below a threshold voltage level for the resistive memory cell.

18. The method of claim 12, wherein the changing of the respective levels of the read voltage and reference voltages comprises:
selecting the adjusted read voltage from among a plurality of externally-provided read voltages having different levels; and
selecting the adjusted reference current from among a plurality of reference currents having different levels.

19. The method of claim 18, wherein the changing of the respective levels of the read voltage and reference voltages further comprises
comparing the cell current passing through the resistive memory cell during the first read operation with the initial reference current and generating a comparison signal, wherein the resistance value range of the resistive memory cell is determined in response to the comparison signal.

20. The method of claim 19, wherein if the cell current is greater than the initial reference current, the level of the initial read voltage is maintained, and if the cell current is less than the initial reference current, the level of the initial read voltage increases to that of the adjusted read voltage.

* * * * *